US011718927B2

(12) United States Patent
Yoshida et al.

(10) Patent No.: US 11,718,927 B2
(45) Date of Patent: Aug. 8, 2023

(54) GROUP III NITRIDE CRYSTAL SUBSTRATE HAVING A DIAMETER OF 4 INCHES OR MORE AND A CURVED C-PLANE WITH A RADIUS OF CURVATURE OF 15 M OR MORE

(71) Applicant: SUMITOMO CHEMICAL COMPANY, LIMITED, Tokyo (JP)

(72) Inventors: Takehiro Yoshida, Ibaraki (JP); Masatomo Shibata, Ibaraki (JP); Seiji Sarayama, Ibaraki (JP); Takashi Sato, Ibaraki (JP); Naoya Miyoshi, Ibaraki (JP); Akishige Murakami, Ibaraki (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 16/353,115

(22) Filed: Mar. 14, 2019

(65) Prior Publication Data

US 2019/0292682 A1     Sep. 26, 2019

(30) Foreign Application Priority Data

Mar. 20, 2018 (JP) .................... 2018-053120

(51) Int. Cl.
*C30B 29/40* (2006.01)
*C30B 25/20* (2006.01)
*C30B 25/10* (2006.01)
*C30B 25/08* (2006.01)

(52) U.S. Cl.
CPC .............. *C30B 25/20* (2013.01); *C30B 25/08* (2013.01); *C30B 25/10* (2013.01); *C30B 29/406* (2013.01)

(58) Field of Classification Search
CPC ....... C30B 23/00; C30B 23/02; C30B 23/025; C30B 23/04; C30B 25/00; C30B 25/02; C30B 25/04; C30B 25/08; C30B 25/10; C30B 25/18; C30B 25/183; C30B 25/186; C30B 25/20; C30B 29/00; C30B 29/10; C30B 29/40; C30B 29/403; C30B 29/406
USPC .......... 117/84, 88–90, 94–95, 101, 103–106, 117/937, 952; 252/62.3 GA
See application file for complete search history.

(56) References Cited

U.S. PATENT DOCUMENTS

| 2007/0096147 A1* | 5/2007 | Oshima ............. H01L 21/02639 257/E21.108 |
| 2008/0118733 A1* | 5/2008 | Oshima ................... C30B 25/00 117/88 |
| 2009/0127564 A1 | 5/2009 | Irikura et al. |

(Continued)

FOREIGN PATENT DOCUMENTS

| CN | 103124811 A | 5/2013 |
| CN | 106103817 A | 11/2016 |

(Continued)

*Primary Examiner* — Kenneth A Bratland, Jr.
(74) *Attorney, Agent, or Firm* — Pearne & Gordon LLP

(57) ABSTRACT

There is provided a method of manufacturing a crystal substrate, including: preparing a first crystal body which is a substrate comprising a single crystal of group III nitride produced by a vapor phase method and having a first main surface, and in which c-plane of the single crystal is curved in a concave spherical shape with a predetermined curvature; and growing a second crystal body comprising a single crystal of group III nitride on the first main surface, in a mixed melt containing an alkali metal and a group III element.

3 Claims, 11 Drawing Sheets

(56) References Cited

U.S. PATENT DOCUMENTS

| | | | |
|---|---|---|---|
| 2011/0256693 A1* | 10/2011 | D'Evelyn | H01L 29/34 117/73 |
| 2012/0000415 A1* | 1/2012 | D'Evelyn | C30B 25/02 117/106 |
| 2012/0074403 A1 | 3/2012 | Fujiwara et al. | |
| 2013/0069075 A1* | 3/2013 | Fujikura | C30B 25/165 117/88 |
| 2016/0186361 A1* | 6/2016 | Koukitu | H01L 21/02458 117/88 |
| 2016/0348272 A1 | 12/2016 | Hayashi et al. | |
| 2017/0145591 A1 | 5/2017 | Yoshida | |
| 2018/0038010 A1 | 2/2018 | Mori et al. | |

FOREIGN PATENT DOCUMENTS

| | | |
|---|---|---|
| CN | 107407008 A | 11/2017 |
| JP | 2009-126727 A | 6/2009 |
| JP | 4424497 B2 | 12/2009 |
| JP | 2017-100936 A | 6/2017 |
| JP | 2018-024539 A | 2/2018 |

* cited by examiner

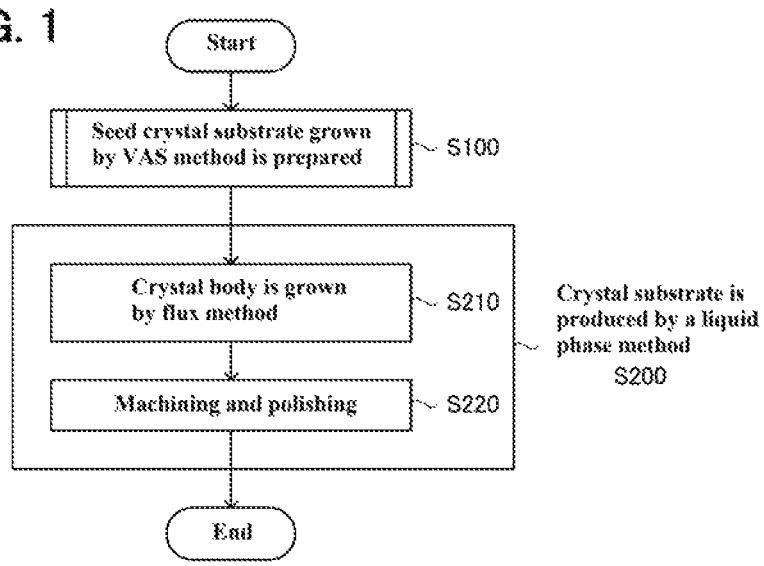

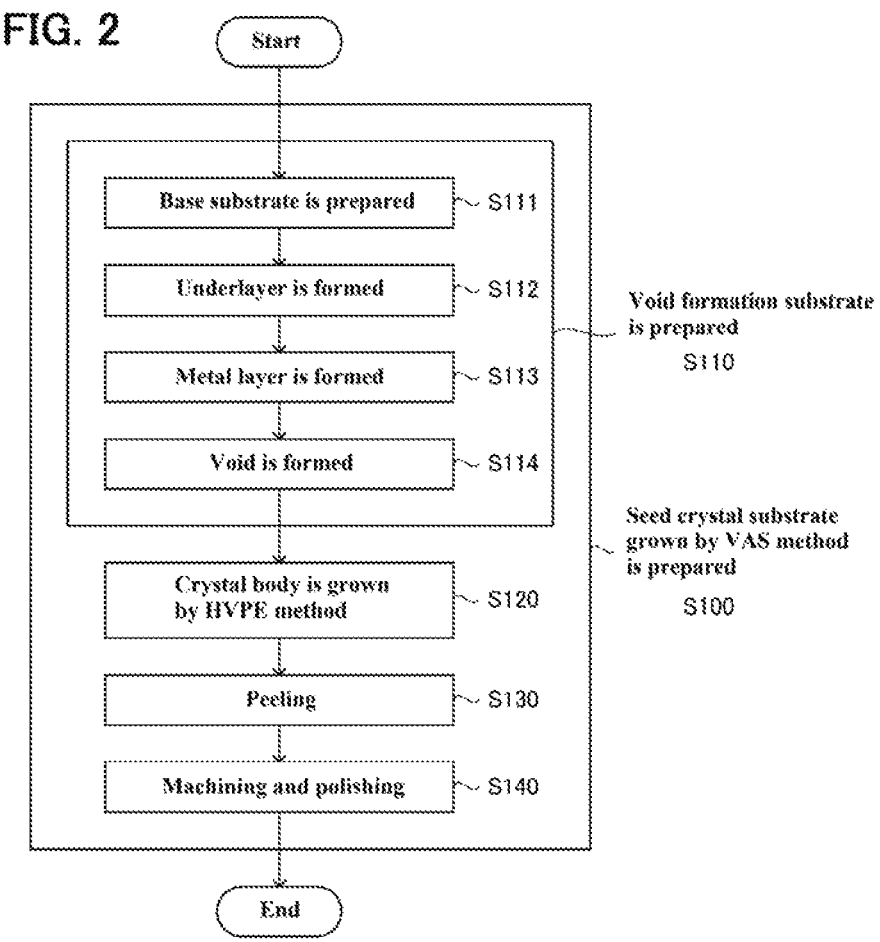

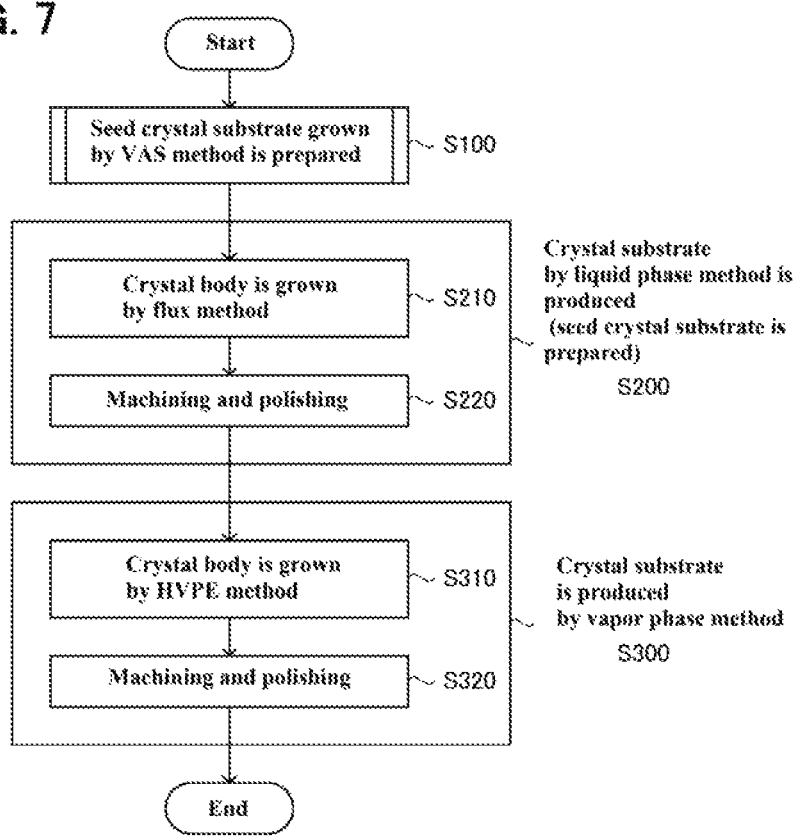

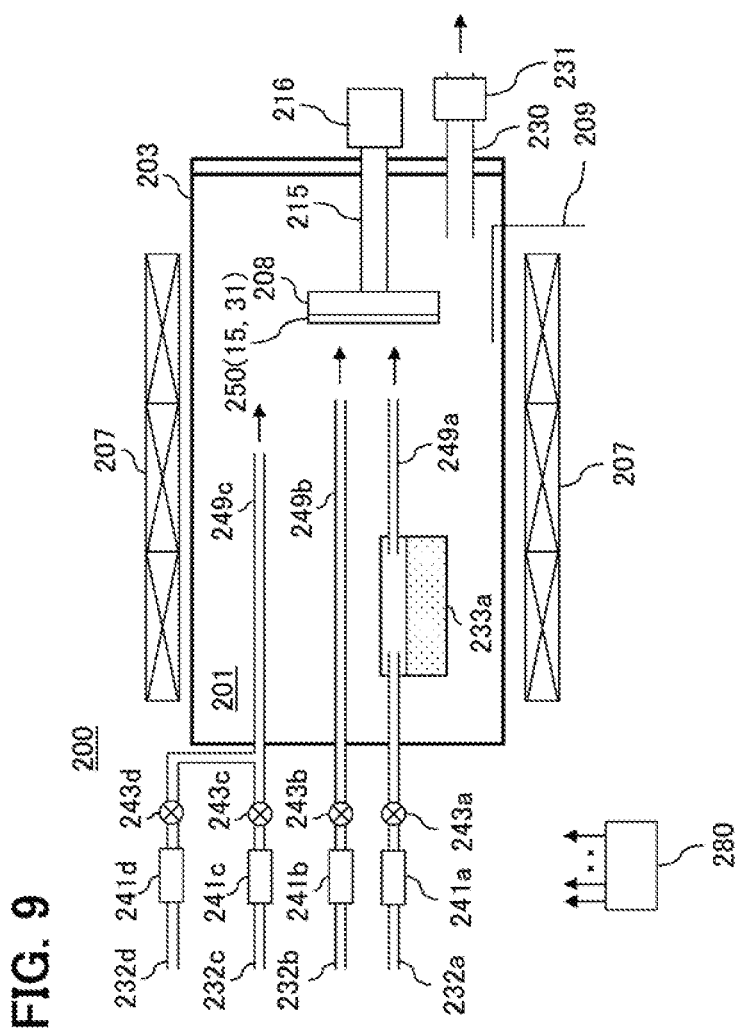

FIG. 11

| Radius of curvature of c-plane (m) | VAS method | Flux method | | HVPE method | |
|---|---|---|---|---|---|
| | | as-grown | Freestanding substrate | as-grown | Freestanding substrate |
| a-axis direction | 11.8 | 24.2 | 19.7 | 27.2 | 27.1 |
| m-axis direction | 12.8 | 27 | 27.6 | 35.6 | 82.8 |

GROUP III NITRIDE CRYSTAL SUBSTRATE HAVING A DIAMETER OF 4 INCHES OR MORE AND A CURVED C-PLANE WITH A RADIUS OF CURVATURE OF 15 M OR MORE

TECHNICAL FIELD

The present invention relates to a method of manufacturing a crystal substrate and a crystal substrate.

DESCRIPTION OF RELATED ART

For example, a crystal substrate comprising group-III nitride such as gallium nitride (simply referred to as a crystal substrate hereafter) is used as a substrate for manufacturing semiconductor devices such as light emitting elements and transistors. In recent years, the need for a crystal substrate with a large diameter (for example, a diameter of 4 inches or more) has been increasing (see, for example, Patent Document 1).

[Patent Document 1] Japanese Patent Laid-Open Publication No. 2017-100936

SUMMARY OF THE INVENTION

Off-angle distribution occurs in a plane of a crystal substrate, due to a fact that c-plane of a group-III nitride crystal constituting the crystal substrate is not flat. As a diameter of the crystal substrate is larger, a width of the off-angle distribution is likely to be larger. Therefore it becomes difficult to make the off-angle uniform in the plane.

An object of the present invention is to provide a novel technology that can improve uniformity of the off-angle in the plane of the crystal substrate comprising group III-nitride.

According to an aspect of the present invention, there is provided a method of manufacturing a crystal substrate, including:

preparing a first crystal body which is a substrate comprising a single crystal of group III nitride produced by a vapor phase method and having a first main surface, and in which c-plane of the single crystal is curved in a concave spherical shape with a predetermined curvature; and growing a second crystal body comprising a single crystal of group III nitride on the first main surface, in a mixed melt containing an alkali metal and a group III element.

According to other aspect of the present invention, there is provided a crystal substrate, including:

a first crystal body which is a substrate comprising a single crystal of group III nitride produced by a vapor phase method and having a first main surface, and in which c-plane of the single crystal is curved in a concave spherical shape with a predetermined curvature; and a second crystal body comprising the single crystal of group III nitride grown on the first main surface using a mixed melt containing an alkali metal and a group III element.

According to other aspect of the present invention, there is provided a crystal substrate which is a substrate comprising a single crystal of group III nitride, and in which c-plane of the single crystal is curved in a concave spherical shape with a radius of curvature of 10 m or more with respect to either one of both main surfaces of the substrate.

Since the second crystal body is grown in a mixed melt containing an alkali metal and a group III element, using the first crystal body as a seed crystal, the radius of curvature of the c-plane in the second crystal body can be made larger than the radius of curvature of the c-plane in the first crystal body. Thereby, a second crystal body can be obtained, with reduced curvature of the c-plane and enhanced uniformity of the off-angle.

BRIEF DESCRIPTION OF THE DRAWINGS

FIG. 1 is a flowchart showing an entire method of manufacturing a crystal substrate according to first to third embodiments of the present invention.

FIG. 2 is a flowchart showing details of step S100 of a method of manufacturing a crystal substrate.

FIG. 7 is a flowchart showing an entire method of manufacturing a crystal substrate according to a modified example of first to third embodiments.

FIG. 9 is a schematic configuration view showing an HVPE apparatus.

FIG. 11 is a table showing the results of an experimental example.

DETAILED DESCRIPTION OF THE INVENTION

Figure 3A:
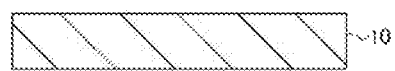
FIG. 3A to 3G are schematic cross-sectional views showing a production process of a seed substrate 21 in step S100.

First to third embodiments of the present invention and modified examples of them will be described hereafter. In the first to third embodiments, explanation will be given for a technology for growing a crystal substrate 31 (hereinafter also referred to as a substrate 31), using a seed crystal substrate 21 (hereinafter also referred to as a seed substrate 21) as a seed crystal. Further in the modified example, explanation will be given for a technology for growing a crystal substrate 41 (also referred to as a substrate 41 hereafter) using the substrate 31 as a seed crystal. The seed substrate 21, the substrate 31 and the substrate 41 each comprises a single crystal of group III nitride. Gallium nitride (GaN) is exemplified as the group III nitride constituting the seed substrate 21, the substrate 31 and the substrate 41.

First Embodiment (1) Method of Manufacturing a Crystal Substrate

A method of manufacturing the substrate 31 according to a first embodiment will be described. FIG. 1 is a flowchart showing an entire method of manufacturing the substrate 31 according to the first embodiment. This manufacturing method includes step S100 of preparing the seed substrate 21 grown by a void formation peeling (VAS) method, and step S200 of producing the substrate 31 by a liquid phase method, specifically a flux method.

(S100: Preparation of a Seed Crystal Substrate Grown by VAS Method)

In step S100, a seed substrate 21 grown by VAS method is prepared. FIG. 2 is a flowchart showing the details of step S100. FIG. 3A to 3G are schematic cross-sectional views showing a production process of the seed substrate 21 in step S100.

(S110: Preparation of a Void Formation Substrate)

Step S100 includes steps S110 to S140. In step S110, a void formation substrate 15 is prepared. Step S110 more specifically includes steps S111 to S114. In step S111, as shown in FIG. 3A, a base substrate 10 is prepared. A sapphire substrate is exemplified as the base substrate 10.

Figure 3B:
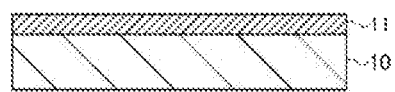

In step S112, as shown in FIG. 3B, an underlayer 11 is formed on the base substrate 10. The underlayer 11 is formed, for example, by laminating a buffer layer comprising low temperature grown GaN and a single crystal layer comprising GaN. The buffer layer and the single crystal layer are formed, for example, by metal organic chemical vapor deposition (MOVPE). For example, trimethylgallium (TMG) is used as a group III raw material, and for example, ammonia ($NH_3$) is used as a group V raw material. A thickness of the buffer layer and a thickness of the single crystal layer are, for example, 20 nm and 0.5 μm, respectively.

Figure 3C:

In step S113, as shown in FIG. 3C, the metal layer 12 is formed on the underlayer 11. The metal layer 12 is formed, for example, by vapor deposition of titanium (Ti) to a thickness of 20 nm.

Figure 3D:
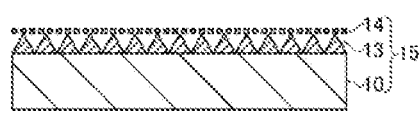

In step S114, as shown in FIG. 3D, the metal layer 12 is nitrided to form a nanomask 14 by heat treatment, and a void is formed in the underlayer 11 to form a void-containing layer 13. The heat treatment is performed, for example, as follows. The base substrate 10 with the underlayer 11 and the metal layer 12 formed thereon is introduced into an electric furnace, and is placed on a susceptor which has a heater. Then, the base substrate 10 is heated in an atmosphere containing hydrogen gas ($H_2$ gas) or hydride gas. Specifically, for example, heat treatment is performed for 20 minutes at a predetermined temperature, for example, at a temperature of 850° C. or more and 1100° C. or less, in an $H_2$ gas stream containing 20% $NH_3$ gas as a nitriding agent gas.

Since the metal layer 12 is nitrided by the heat treatment, a nanomask 14 having a high density of micropores is formed on the surface. Further, since a part of the underlayer 11 is etched through the micropores of the nanomask 14, voids occur in the underlayer 11 to form the void-containing layer 13. Thus, in step S110, the void formation substrate 15 is prepared, which has the void-containing layer 13 and the nanomask 14 formed on the base substrate 10.

The heat treatment is preferably performed so that a distribution of the micropores of the nanomask 14 and a distribution of the voids of the void-containing layer 13 become uniform in the plane. Therefore, for example, it is preferable that a heating condition of the heater be adjusted so that the temperature distribution approaches in-plane uniformity, and further, for example, it is preferable that the heat treatment is performed while rotating the susceptor.

(S120: Crystal Growth by HVPE)

Figure 3E:
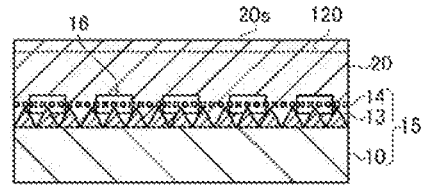

In step S120, as shown in FIG. 3E, a crystal body 20 is grown on the nanomask 14 of the void formation substrate 15. The crystal body 20 is grown by a vapor phase method, specifically a hydride vapor phase epitaxy (HVPE) method.

Here, a HVPE apparatus 200 will be described. FIG. 9 is a schematic configuration view showing the HVPE apparatus 200.

The HVPE apparatus 200 comprises a heat resistant material such as quartz, and includes an airtight container 203 with a film forming chamber 201 included therein. In the film formation chamber 201, a susceptor 208 for holding a substrate 250 to be processed is provided. The susceptor 208 is connected to a rotation shaft 215 of a rotation mechanism 216, and is configured to be rotatable. Gas supply pipes 232a to 232c for supplying hydrochloric acid (HCl) gas, $NH_3$ gas and nitrogen gas ($N_2$ gas) into the film forming chamber 201 are connected to one end of the airtight container 203. A gas supply pipe 232d for supplying hydrogen ($H_2$) gas is connected to the gas supply pipe 232c. Flow controllers 241a to 241d, and valves 243a to 243d are respectively provided on the gas supply pipes 232a to 232d sequentially from an upstream side. A gas generator 233a containing Ga melt as a raw material is provided downstream of the gas supply pipe 232a. A nozzle 249a is connected to the gas generator 233a, for supplying gallium chloride (GaCl) gas toward a substrate 250 held on the susceptor 208, the galliun chloride gas being generated by a reaction of HCl gas with Ga melt. Nozzles 249b and 249c are respectively connected to a downstream side of the gas supply pipes 232b and 232c, for supplying various gases toward the substrate 250 held on the susceptor 208, the various gases being supplied from these gas supply pipes. An exhaust pipe 230 is provided at the other end of the airtight container 203, for exhausting inside of the film forming chamber 201. A pump 231 is provided to the exhaust pipe 230. A zone heater 207 is provided on an outer periphery of the airtight container 203, for heating inside of the gas generator 233a and the substrate 250 held on the susceptor 208 to a desired temperature, and a temperature sensor 209 is provided in the airtight container 203, for measuring the temperature in the film forming chamber 201, respectively. Each member of the HVPE apparatus 200 is connected to a controller 280 configured as a computer, and is configured so that processing procedures and processing conditions described later are controlled based on a program executed on the controller 280.

In step S120, for example, the following processing procedure can be performed using the HVPE apparatus 200. First, Ga is contained in the gas generator 233a, as a raw material. Further, the void formation substrate 15 is held on the susceptor 208 as a substrate 250 to be processed. Then, a mixed gas of $H_2$ gas and $N_2$ gas is supplied into the film forming chamber 201 while heating and exhausting the inside of the film forming chamber 201. Then, in a state where the temperature and the pressure inside of the film forming chamber 201 reaches a desired film forming temperature and film forming pressure, and the atmosphere in the film forming chamber 201 becomes a desired atmosphere, gas is supplied from the gas supply pipes 232a and 232b, and GaCl gas and $NH_3$ gas are supplied to the void formation substrate 15, as film forming gases.

The following are exemplified as processing conditions for performing step S120.

Growth temperature T g: 980 to 1,100° C., preferably 1,050 to 1,100° C.

Pressure in the film forming chamber 201: 90 to 105 kPa, preferably 90 to 95 kPa.

Partial pressure of GaCl gas: 0.2 to 15 kPa.

Partial pressure of $NH_3$ gas/Partial pressure of GaCl gas: 4 to 20.

$N_2$ gas flow rate/$H_2$ gas flow rate: 1 to 20.

In the growth processing, since GaN crystal that has started to be grown starting from the void-containing layer 13 appear on the surface after passing through the micropores of the nanomask 14, initial nuclei are formed on the nanomask 14. Since the initial nuclei grow in a thickness direction (vertical direction) and in in-plane direction (lateral direction) and are mutually bonded in the plane, a crystal body 20 of a continuous film comprising GaN single crystal is formed. A tensile stress is introduced to the crystal body 20 because a force of attraction is exerted between the bonded initial nuclei. Further, in a region where the initial nuclei are not formed, air gaps 16 caused by the void of the void containing layer 13 are formed between the nanomask 14 and the crystal body 20.

It is preferable that the growth processing be performed such that the distribution of the initial nuclei and the distribution of the air gaps 16 become uniform in the plane. Therefore, for example, it is preferable that a heating state by the zone heater 207 be adjusted so that the temperature distribution approaches in-plane uniformity, and for example, it is preferable that the growth processing be performed while rotating the susceptor 208. It is also preferable that the distribution of initial nuclei and the distribution of air gaps 16 become uniform in the plane, so that the distribution of the initial nuclei and the distribution of the air gaps 16 become uniform in the plane. A region where dislocation density is locally very high in the plane (dislocation concentration region having a dislocation density of, for example, $1 \times 10^7/cm^2$ or more) does not occur due to the uniform distribution of the initial nuclei, and therefore the distribution of dislocation density becomes uniform. Also, the tensile stress becomes uniform in the plane due to the uniform distribution of the initial nuclei.

At a stage when the crystal body 20 as a continuous film is formed, facets of the initial nuclei still remain. Therefore, a main surface 20s, which is a growth side surface of the crystal body 20 (the surface opposite to the void formation substrate 15), has a top surface which is a smooth surface, and a pocket which is a recess surrounded by the facets. By making the growth time sufficiently long, the pocket is filled and the main surface 20s becomes a smooth surface as a whole. The seed substrate 21 utilizing the pocket will be described in a second embodiment (see FIGS. 5A to 5C) described later.

At the time of growth of the crystal body 20, a polarity inversion region (inversion domain, ID) in which the polarity in the c-axis direction is inverted may occur. The "single crystal" in the present specification is not limited to a crystal not containing ID, but also includes a crystal containing a plurality of IDs. The seed substrate 21 using ID will be described in a third embodiment (see FIGS. 6A to 6C) described later.

The thickness of the crystal body 20 to be grown is preferably a thickness at which at least one freestanding seed substrate 21 can be obtained from the crystal body 20, for example, a thickness of 0.2 mm or more. An upper limit of the thickness of the crystal body 20 to be grown is not particularly limited.

(S130: Peeling)

Figure 3F:
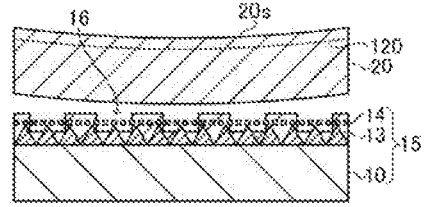

In step S130, as shown in FIG. 3F, the crystal body 20 is peeled off from the void formation substrate 15. The peeling is performed by naturally peeling the crystal body 20 from the void formation substrate 15, at the boundary of the air gap 16 formed between the crystal body 20 and the nanomask 14, during the growth of crystal 20, or in the process of cooling the inside of the film forming chamber 201 after the growth of the crystal body 20. Since the air gaps 16 are uniformly distributed, the peeling is performed in a state where stress concentration on a specific region is unlikely to occur.

After the crystal body 20 of a predetermined thickness is grown, the temperature inside of the film forming chamber 201 is lowered to a temperature at which an unloading operation is possible, and the void formation substrate 15 and the crystal body 20 are unloaded from the film forming chamber 201.

Due to the tensile stress introduced during the growth of the crystal body 20, the peeled crystal body 20 warps so that the growth side surface is recessed. In the crystal body 20, since the tensile stress is uniform in the plane, warpage occurs uniformly. Thereby, c-plane 120 of the GaN single crystal constituting the peeled crystal body 20 is curved in a concave spherical shape toward the inside of the crystal body 20, when the main surface 20s is viewed from +c side. Here, "spherical" means a curved surface that is spherically approximated. Further, "spherically approximated" means approximation to a true spherical surface (true sphere) or an elliptical spherical surface (long sphere) within a predetermined error range.

The uniformity of the grown crystal is likely to be degraded at an outermost periphery of the crystal body 20 in a plan view as viewed from a normal direction of the center of the main surface 20s. Therefore, the above description "c-plane 120 is curved in a spherical shape" is not established on the outermost periphery of the crystal body 20 in some cases. The above description "c-plane 120 is curved in a spherical shape" may be established in a region occupying an area of 80% or more on the center side of the main surface 20s in plan view (hereinafter, also referred to as a major area). The same description is applied to c-plane 121 of the seed substrate 21, c-plane 130 of a crystal body 30, c-plane 131 of a substrate 31, c-plane 140 of a crystal body 40 and c-plane 141 of a substrate 41 described later. The following explanation for the radius of curvature and the like of the c-planes 120, 121, 130, 131, 140 and 141 is given for the major area.

The description "in the major area, c-plane 120 of the crystal body 20 is curved in a concave spherical shape toward the inside of the crystal 20 when the main surface 20s is viewed from the +c side" is also described as simply: "c-plane 120 of the crystal body 20 is curved into a concave spherical shape", in order to avoid complexity. The same description is applied to c-plane 121 of the seed substrate 21, c-plane 130 of the crystal body 30, c-plane 131 of the substrate 31, c-plane 140 of the crystal body 40 and c-plane 141 of the substrate 41 described later.

The off-angle of the crystal body 20 is defined as an angle formed by the c-axis direction of the GaN single crystal constituting the crystal body 20 and the normal direction of the center of the main surface 20s. The same definition is applied to the off-angle of the seed substrate 21, crystal body 30, the substrate 31, the crystal body 40 and the substrate 41, respectively, described later.

Since the c-plane 120 is curved, the off-angle of the crystal body 20 changes according to a position in the main surface 20s. Namely, the peeled crystal body 20 has an off-angle distribution. The off-angle at the center of the main surface 20s is a center off angle. The center off-angle can be controlled by adjusting the off-angle of the base substrate 10, and may be set to be inclined in a predetermined direction (for example a-axis direction, and for example m-axis direction).

When the center off-angle is inclined in a predetermined direction, the radius of curvature of the c-plane 120 may be different between a direction parallel to an inclination direction and a direction perpendicular to the inclination direction. Namely, the curved shape of the c-plane 120 may be approximated not only to a perfect spherical surface but also to an elliptical sphere. When approximated to a perfect spherical surface, the shape of the c-plane 120 is represented by one radius of curvature. When approximated to an elliptical sphere, the shape of the c-plane 120 is represented by two radii of curvature.

In a crystal body grown, for example, by a method of producing a dislocation concentration region by non-uniformly distributing a generation density of initial nuclei such as ELO (Epitaxially Lateral Overgrowth) using a stripe mask, the shape of the c-plane is distorted. Namely, in such a crystal body, the radius of curvature of the c-plane varies in the plane. It is also probable that a direction of the c-plane unevenness is reversed depending on a place. Therefore, the shape of the c-plane in such a crystal body cannot be properly spherically approximated by a constant radius of curvature.

(S140: Machining and Polishing)

Figure 3G:
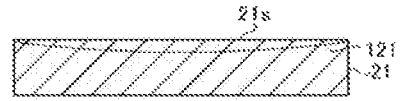

In step S140, as shown in FIG. 3G, if necessary, machining and/or polishing is applied to the crystal body 20 peeled off in step S130, to thereby obtain the seed substrate 21 (crystal body 20 as a freestanding substrate). For example, cutting is performed with a wire saw as machining. For example, one seed substrate 21 may be obtained from an entire crystal body 20. Further, for example, a plurality of seed substrates 21 may be obtained from the entire crystal body 20 by slicing the crystal body 20 into a plurality of sheets. The obtained seed substrate 21 may or may not be polished, if necessary. One of the two main surfaces may be polished. The crystal body 20 peeled off in step S130 may be used as the seed substrate 21 as it is.

The radius of curvature of the c-plane 121 of the seed substrate 21 may change from the radius of curvature of the c-plane 120 of the peeled crystal body 20, due to machining or polishing in step S140.

FIG. 3G shows the seed substrate 21 configured in a flat plate shape. The seed substrate 21 is configured to have c-plane 121 as a low index crystal plane closest to the main surface 21s, so that the c-plane 121 is curved in a concave spherical shape with respect to the main surface 21s (with respect to the main surface 21s of either one of both main surfaces of the seed substrate 21). The c-plane 121 has a constant radius of curvature (in the major area) because distortion from the spherical shape is suppressed.

As described above, in step S100, the seed substrate 21 grown by VAS method is prepared. The radius of curvature of the c-plane 121 of the seed substrate 21 is, for example, 3 m or more, and for example, 10 m or more. The radius of curvature of the c-plane 121 of the seed substrate 21 is smaller than the radius of curvature of the c-plane 131 of the substrate 31 as described later, and is, for example, 20 m or less, and for example, 30 m or less. As described above, the fact that the c-plane 121 of the seed substrate 21 has a spherically approximated shape means that the in-plane distribution of the dislocation density is uniform. The fact that the in-plane distribution of the dislocation density is uniform (that is, there is no region where the dislocation density is extremely high locally), is expressed under the following conditions specifically for example. In a 3 mm square measurement area of the main surface 21s of the seed substrate 21, an observation area with a diameter of 500 μm per point is scanned to measure about 10 places by a cathode luminescence (CL) method. At this time, a largest dislocation density is less than $1 \times 10^7/cm^2$, preferably for example $5 \times 10^6/cm^2$ or less. An average dislocation density is preferably, for example, $3 \times 10^6/cm^2$ or less. A smallest dislocation density is not particularly limited. The ratio of the largest dislocation density to the smallest dislocation density can be larger as the smallest dislocation density is lower, and a standard is for example, 100 times or less, and for example, 10 times or less.

(S200: Production of a Crystal Substrate by a Liquid Phase Method)

Figure 4A:
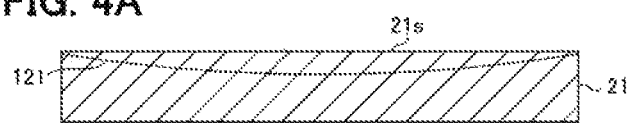
FIG. 4A to 4C are schematic cross-sectional views showing a production process of a substrate 31 in step S200 of a first embodiment.
Figure 4B:
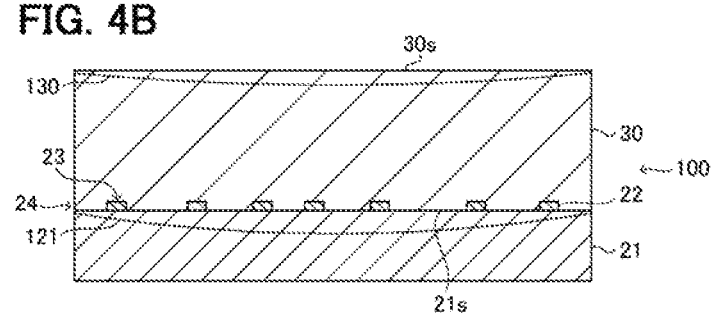
Figure 4C:
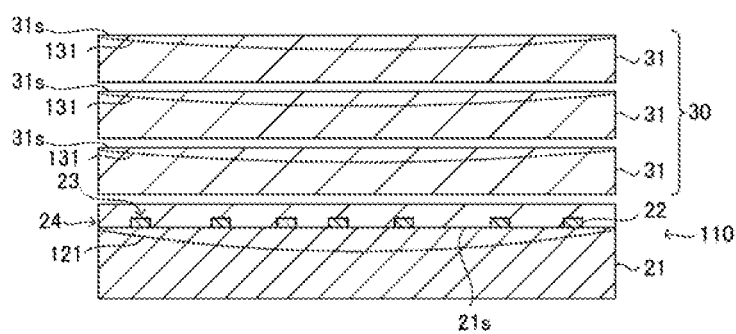

After the seed substrate 21 is prepared in step S100, the substrate 31 is produced by a liquid phase method, specifically, a flux method in step S200. FIGS. 4A to 4C are schematic cross-sectional views showing a production process of the substrate 31 in step S200 of a first embodiment. FIG. 4A shows the seed substrate 21 prepared in step S100. The first embodiment exemplifies the seed substrate 21 configured in a flat plate shape, that is, the seed substrate 21 in which the main surface 21s which is a base under the crystal growth is flat over an entire region, and also exemplifies the seed substrate 21 not including ID.

(S210: Growth of the Crystal Body by the Flux Method)

Figure 10:
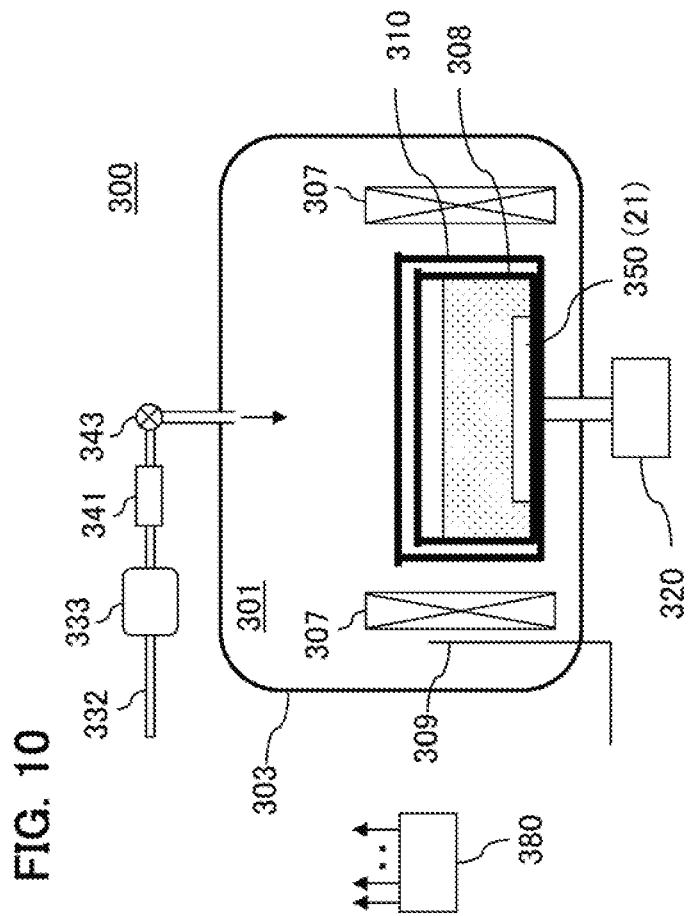
FIG. 10 is a schematic configuration view showing a flux liquid phase growth apparatus.

Step S200 includes steps S210 and S220. In step S210, as shown in FIG. 4B, the crystal body 30 is grown on the seed substrate 21 by the flux method. In the flux method, group III nitride (in this example GaN) is grown in a mixed melt containing an alkali metal used as a flux (solvent) and a Group III element (Ga in this example). Sodium (Na) is preferably used as the alkali metal to be the flux. However, other alkali metal elements such as lithium (Li) and potassium (K) may also be used. Further, these elements may be used as a mixture. The metal used as the flux may be one obtained by adding an alkaline earth metal to the alkali metal. As the alkaline earth metal, magnesium (Mg), calcium (Ca) or the like may be used alone or in combination. Here, a flux liquid phase growth apparatus 300 will be described. FIG. 10 is a schematic configuration view showing a flux liquid phase growth apparatus.

The flux liquid phase growth apparatus 300 includes a pressure resistant vessel 303. The pressure resistant container 303 comprises stainless steel (SUS) or the like, and a pressure chamber 301 which can be pressurized to a high pressure of, for example, about 10 MPa is formed inside of the pressure resistant container 303. A crucible 308, a lid of the crucible 308, a reaction vessel 310, heaters 307 for heating inside of the crucible 308, and a measurement sensor 309 for measuring a temperature inside of the pressure chamber 301 are provided inside of the pressure chamber 301. The crucible 308 is configured to store a mixed melt comprising Na and Ga, for example, using Na as a flux, and is configured so that the substrate 350 to be processed can be immersed in the mixed melt with its main surface (base under crystal growth) facing up. The reaction container 310 includes a reaction vessel body and a reaction vessel lid, and the crucible 308 is stored inside of the reaction vessel 310. The heaters 307 are provided outside of the reaction vessel 310. The flux liquid phase growth apparatus 300 also includes a rotation mechanism 320, and the reaction vessel 310, that is, the crucible 308 stored therein can be rotated by the rotation mechanism 320. A gas supply pipe 332 for supplying $N_2$ gas into the pressure chamber 301 is connected to the pressure resistant vessel 303. A pressure controller 333, a flow controller 341, and a valve 343 are provided on the gas supply pipe 332 sequentially from an upstream side. Each member of the flux liquid phase growth apparatus 300 is connected to a controller 380 configured as a computer, and processing procedures and processing conditions to be described later are controlled based on a program executed on the controller 380.

Step S210 can be executed, for example, by the following processing procedure using the flux liquid phase growth apparatus 300. First, the seed substrate 21 which is the substrate 350 to be processed and the raw materials (Na and Ga) of the mixed melt are stored in the crucible 308, the pressure container 303 is sealed, with an additive agent stored therein as needed. Then, $N_2$ gas is supplied into the pressure chamber 301 and heating is started after a predetermined gas pressure is achieved. Start of heating by the heaters 307 causes Na and Ga in the crucible 308 to melt, and a mixed solution (Ga melt using Na as a medium, a mixed melt containing Na and Ga) is formed. After raising the temperature to a crystal growth temperature, the gas pressure is adjusted to a crystal growth pressure. Nitrogen (N) is dissolved in the mixed melt, and this state is maintained for a predetermined time. The "mixed melt" in the present specification is not limited to one in which nitrogen is not dissolved, but also includes one in which nitrogen is dissolved.

The following are exemplified as processing conditions for performing step S210.

Growth temperature (temperature of mixed melt): 700 to 1,000° C., preferably 800 to 900° C., more preferably 870 to 890° C.

Growth pressure (pressure in the pressure chamber): 0.1 to 10 MPa, preferably 1 to 6 MPa, more preferably 2.5 to 4.0 MPa.

Na concentration in mixed melt [Na/(Na+Ga)]: 10 to 90%, preferably 40 to 85%, more preferably 70 to 85%: This Na concentration is molar concentration.

As the additive agent into the mixed melt, for example, at least one of carbon (C) and germanium (Ge) may be added. The addition amount in this case is, for example, C concentration [C/(C+Ga+Na)]: 0.1 to 1.0%, and for example, Ge concentration [Ge/(Ge+Ga)]: 0.5 to 4.0%.

A distance between a gas-liquid interface of the mixed melt and nitrogen gas and the main surface of the seed substrate 21: 3 to 70 mm, preferably 5 to 40 mm, more preferably 20 to 35 mm.

A rotation speed: 1 to 30 rpm, preferably 5 to 20 rpm, more preferably 7 to 15 rpm.

By this growth processing, as shown in FIG. 4B, GaN single crystal grows on the main surface 21s of the seed substrate 21 to form the crystal body 30. Further, in the growth processing, the alkali metal (Na in this example) contained in the mixed melt is taken into the interface between the seed substrate 21 and the crystal 30 as inclusions 22. Therefore, an intermediate layer 24 having a plurality of closed spaces 23 containing the alkali metal is formed. For example, by performing the growth processing under the processing conditions described above, the inclusions 22 can be taken into the interface between the seed substrate 21 and the crystal body 30 to form the intermediate layer 24.

FIG. 4B shows a formation mode of forming the inclusions 22 above the main surface 21s of the seed substrate 21. The formation mode of the inclusions 22 is not limited thereto. Here, the main surface 21s used as a reference of a height position is the main surface 21s in the case where meltback of the seed substrate 21 by the mixed melt does not occur. Since the meltback occurs before growth of the crystal body 30, the inclusions may be formed under the main surface 21s, that is, may be formed on the seed substrate 21 side with respect to the main surface 21s. The intermediate layer 24 includes a region where the inclusions 22 are formed, and there are the following cases: a case of including a region above the main surface 21s, a case of including a region below the main surface 21s, or a case of including both regions. The inclusions 22 are formed so as to be interposed between the seed substrate 21 and the crystal 30, namely, on an interface between the seed substrate 21 and the crystal body 30. A thickness of the intermediate layer including the region where the inclusions 22 are formed is, for example, about 150 μm.

As shown in FIG. 4B, the intermediate layer 24 includes a plurality of inclusions 22 spatially dispersed in a cross section parallel to a thickness direction of the laminated crystal substrate 100 including the seed substrate 21 and the crystal body 30, and the intermediate layer 24 forms a transition region for uniformly growing the GaN single crystal constituting the crystal body 30, from the GaN single crystal constituting the seed substrate 21, by the flux method. Since the growth processing is performed, for example, under the above-described processing condition, the inclusions 22 can be distributed uniformly (randomly) or distributed in a non-localized manner in the plane of the intermediate layer 24.

Since the crystal body 30 is grown reflecting crystallinity of the seed substrate 21, the c-plane 130 of the GaN single crystal constituting the crystal body 30 is curved in a concave spherical shape with respect to the main surface 30s of the crystal body 30. It is found by the present inventors, that the radius of curvature of the c-plane 130 of the crystal body 30 can be larger than the radius of curvature of the c-plane 121 of the seed substrate 21, by growing the crystal body 30 by the flux method, using the seed substrate 21 grown by VAS method as a seed crystal. The reason is presumed as follows: the force by which the crystal body 30 is restrained by the seed substrate 21 is weakened by the intermediate layer 24 interposed on the interface between the seed substrate 21 and the crystal body 30, and a compressive stress generated in the crystal body 30 is relaxed as the crystal body 30 grows.

The thickness of the crystal body 30 to be grown is preferably a thickness at which at least one freestanding substrate 31 can be obtained from the crystal body 30, for example, a thickness of 0.2 mm or more. The upper limit of the thickness of the crystal body 30 to be grown is not particularly limited. Meanwhile, when the thickness of the crystal body 30 is thinner than 0.2 mm, a laminated crystal substrate 100 in which the seed substrate 21, the intermediate layer 24 and the crystal body 30 are integrated together, may be used as the seed substrate for vapor-phase growing the crystal body 40 in a modified example described later, without separating the crystal body 30 into the substrates 31 described later. Even such a thin crystal body 30 has an effect of expanding the radius of curvature of the c-plane. After the crystal body 30 of a predetermined thickness is grown, the inside of the pressure resistant vessel 303 is returned to a room temperature and an atmospheric pressure, and the seed substrate 21 with the crystal body 30 formed thereon is taken out from the crucible 308.

As a feature of a laminated crystal substrate 100 having the seed substrate 21 and the crystal body 30 grown on the seed substrate 21, for example, the intermediate layer 24 is provided on the interface between the seed substrate 21 and the crystal 30, and for example, the radius of curvature of the c-plane 130 in the crystal body 30 is larger than the radius of curvature of the c-plane 121 in the seed substrate 121.

(S220: Machining and Polishing)

In step S220, as shown in FIG. 4C, the crystal body 30 grown in step S210 is cut by machining, for example, a wire saw, and separated from the seed substrate 21. Since the crystal body 30 is cut at a position appropriately separated from the interface between the seed substrate 21 and the crystal body 30, a root portion of the crystal body 30 including the intermediate layer 24 is not included in the separated crystal body 30. The laminated crystal substrate 110 having the seed substrate 21 and a root portion of the crystal body 30 including the intermediate layer 24, which are left by separating the crystal body 30, may be reused as a seed crystal for performing the crystal growth by the flux method or the like.

The substrate 31 (crystal body 30 as a freestanding substrate) is obtained by applying machining and polishing, or one of them to the separated crystal body 30 if necessary. For example, one sheet of substrate 31 may be obtained from the entire crystal body 30. Further for example, a plurality of substrates 31 may be obtained from the entire crystal 30 by slicing the crystal body 30 into a plurality of sheets. The obtained substrate 31 may or may not be polished, if necessary. One of the two main surfaces may be polished. The separated crystal body 30 may be used as the substrate 31 as it is.

The radius of curvature of the c-plane 130 of the crystal body 30 may change from the radius of curvature of the c-plane 130 of the crystal body 30 before separation, due to the separation of the crystal 30 from the seed substrate 21. Further, the radius of curvature of the c-plane 131 of the substrate 31 may change from the radius of curvature of the c-plane 130 of the separated crystal body 30, due to machining or polishing on the separated crystal body 30. However, even if such a change in the radius of curvature occurs, the radius of curvature of the c-plane 130 of the separated crystal body 30 and the radius of curvature of the c-plane 131 of the substrate 31 are large, compared to the radius of curvature of the c-plane 121 of the seed substrate 21. This tendency is maintained.

FIG. 4C exemplifies the substrate 31 configured in a flat plate shape. The substrate 31 is configured to have the c-plane 131 as a low index crystal plane closest to the main surface 31s, so that the c-plane 131 is curved in a concave spherical shape with respect to the main surface 31s (with respect to either main surface 31s of both main surfaces of substrate 31). The c-plane 131 has a constant radius of curvature (in the major area) because distortion from the spherical shape is suppressed.

As described above, in step S200, the substrate 31 is produced by the flux method using the seed substrate 21 grown by VAS method as a seed crystal. The radius of curvature of the c-plane 131 of the substrate 31 is larger than the radius of curvature of the c-plane 121 of the seed substrate 21, and preferably it is 10 m or more, more preferably it is 15 m or more, and more preferably it is 20 m or more. The substrate 31 is used, for example, as a substrate for manufacturing a semiconductor device. The size of the substrate 31 is preferably, for example, 4 inches (10.16 cm) or more in diameter from the market demand for a large diameter substrate. Correspondingly, the size of the seed substrate 21 is preferably, for example, 4 inches or more in diameter. Since the c-plane 131 is spherical, the off-angle does not change irregularly, and the off-angle changes slowly in a certain region in the main surface 31s (for example, in a region corresponding to one semiconductor device). Also, since the c-plane 131 is spherical, an entire off-angle distribution in the main surface 31s can be easily grasped. Namely, since the radius of curvature of the c-plane 131 is large, in-plane off-angle distribution can be small despite a large diameter substrate, and since the c-plane is spherical, the off-angle changes regularly. Accordingly, the substrate 31 is expected to contribute to a performance improvement of the semiconductor device manufactured using this substrate, and for example, it is expected to be used as a substrate for manufacturing a power device having a higher energy saving effect than existing devices. The substrate 31 may also be used as a seed crystal, for example, as in a modified example described later.

(2) Effects Obtained by the Present Embodiment

According to the present embodiment, one or more of the following effects can be obtained.

(a) Since the substrate 31 is grown by the flux method using the seed substrate 21 grown by VAS method as a seed crystal, the radius of curvature of the c-plane 131 in the substrate 31 can be larger than the radius of curvature of the c-plane 121 in the seed substrate 21. As the curvature radius of the c-plane 131 is larger, the curvature of the c-plane 131 is reduced. Therefore, the width of the off-angle distribution in the plane of the substrate 31 can be reduced. Namely, it is possible to obtain the substrate 31 with high in-plane uniformity of the off-angle. Since the radius of curvature expands from the spherical c-plane 121 of the seed substrate 21, the spherical c-plane 131 of the substrate 31 is obtained. Therefore, in the substrate 31, the off-angle changes gently overall in the plane, compared to the seed substrate 21. In the substrate 31, since the off-angle changes gently overall in the plane compared to the seed substrate 21, the width of the off-angle distribution can be small.

As the diameter of the substrate 31 becomes large, the width of the off-angle distribution is likely to be large, and therefore it is particularly preferable that this method capable of reducing the width of the off-angle distribution be applied to the substrate 31 having a large diameter (for example, a diameter of 4 inches or more).

(b) The intermediate layer 24 can be formed utilizing the phenomenon in which inclusions 22 are taken into the interface between the seed substrate 21 and the crystal body 30, along with the crystal growth by the flux method, and the radius of curvature of the c-plane 131 of the substrate 31 can be large. Since the inclusions 22, namely, the closed spaces 23 are distributed uniformly (randomly) in the plane of the interface between the seed substrate 21 and the crystal 30, or in a dispersed state without being localized, the effect of increasing the radius of curvature can be obtained uniformly in the plane.

(c) Since expansion of the radius of curvature is caused from the concave spherical c-plane 121 of the seed substrate 21, the concave spherical c-plane 131 of the substrate 31 can be obtained. Therefore, the c-plane 131 does not locally have a convex curvature, thus suppressing a local strain in the substrate 31. Thereby, the substrate 31 is resistant to cracking and chipping, and is easy to process. Therefore, the yield can be improved in the production process of the substrate 31 and in the device manufacturing step using the substrate 31.

(d) When the crystal body 30 is grown by the flux method, the effect of inhibiting propagation of dislocations from the seed substrate 21 by the inclusions 22 is also expected. Therefore, the effect of further reducing the dislocation density of the substrate 31 is also obtained, compared to the dislocation density of the seed substrate 21. In the substrate 31, a largest dislocation density is preferably, for example, $3 \times 10^6 /cm^2$ or less, and an average dislocation density is preferably, for example, $1 \times 10^6 /cm^2$ or less. A smallest dislocation density is not particularly limited. In the substrate 31, the ratio of the largest dislocation density to the smallest dislocation density can be larger as the smallest dislocation density is lower, and a standard is, for example, 100 times or less, and for example, 10 times or less.

The substrate 31 is easy to use its large area in the plane as an area for manufacturing a semiconductor device, because the distribution of the dislocation density is uniform. Therefore, the substrate 31 can be preferably used for example in applications for efficiently manufacturing a large number of semiconductor devices, or for example in applications for manufacturing large area semiconductor devices, for example.

Second Embodiment (1) Method of Manufacturing a Crystal Substrate

A method of manufacturing the substrate 31 according to a second embodiment will be described. The differences from the first embodiment are mainly described below. In the second embodiment as well, the substrate 31 is produced by the flux method through the steps S100 and S200 shown in FIG. 1, using the seed substrate 21 grown by VAS method as a seed crystal. However, the aspect of the seed substrate 21 is different from that of the first embodiment.

Figure 5A:
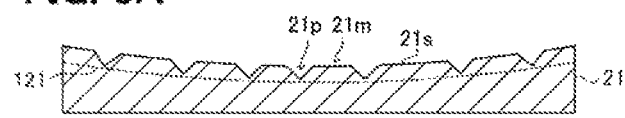
FIG. 5A to 5C are schematic cross-sectional views showing a production process of the substrate 31 in step S200 of a second embodiment.
Figure 5B:
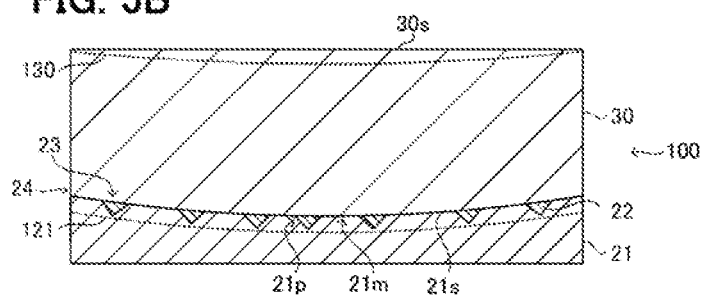
Figure 5C:
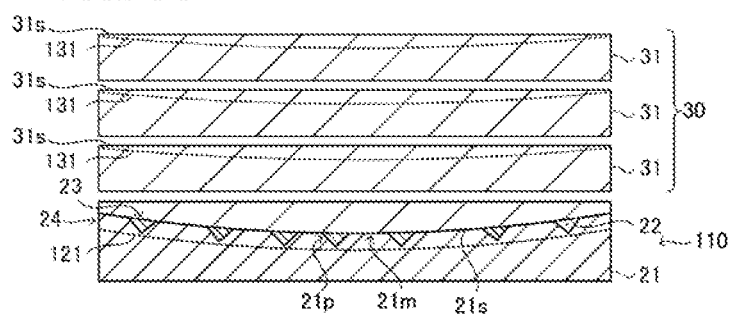

FIG. 5A to 5C are schematic cross-sectional views showing a production process of the substrate 31 in step S200 of the second embodiment. FIG. 5A shows the seed substrate 21 prepared in step S100. In the seed substrate 21 of the second embodiment, the main surface 21*s*, which is a base under crystal growth, has main regions 21*m* and pockets 21*p*. The main regions 21*m* are smooth upper surface portions of the main surface 21*s*, and the pockets 21*p* are recessed regions with respect to the main regions 21*m*. The seed substrate 21 of the second embodiment differs from the seed substrate 21 of the first embodiment in that it has the pockets 21*p*.

As described with reference to FIG. 3E, when growing the crystal body 20 constituting the seed substrate 21, while the growth time is relatively short, the pocket, which is a recess surrounded by the facets of the initial core, remains unfilled. In the second embodiment, the seed substrate 21 is constituted so that the growth-side surface of the crystal body 20, with the pockets remained, is the main surface 21*s*.

Step S210 shown in FIG. 5B, namely, the step of growing the crystal body 30 on the seed substrate 21 by the flux method, and step S220 shown in FIG. 5C, namely, the step of obtaining the substrate 31 from the grown crystal 30, are the same as the first embodiment. The same conditions as in the first embodiment are exemplified as processing conditions for the crystal growth processing in step S210.

The pockets 21*p* are provided as regions configured to easily retain the mixed melt in the flux method, namely, the regions configured to easily form the inclusions 22 (also referred to as inclusion formation regions hereafter). In other words, the inclusion formation regions are the regions in the main surface 21*s* of the seed substrate 21, having a feature such that the inclusions 22 are easily formed, compared with regions other than the inclusion formation regions. When growing the crystal body 30 by the flux method, the inclusions 22 are formed by the mixed melt entering into the pockets 21*p*. The inclusions 22 become a cap layer that blocks the surfaces of pockets 21*p*, so that the crystal growth is suppressed by the cap layer (inclusions 22), with the pockets 21*p* as a base. The cap layer (inclusions 22) is embedded by the crystal body 30 grown with the main region 21*m* as a base, and the closed spaces 23 containing the alkali metal contained in the mixed melt are formed at positions corresponding to the pockets 21*p* on the interface between the seed substrate 21 and the crystal body 30.

In addition to the feature given in the first embodiment, the feature of the laminated crystal substrate 100 having the seed substrate 21 and the crystal body 30 grown on the seed substrate 21, is as follows: the seed substrate 21 has the main regions 21*m* and the pockets 21*p*, and the closed spaces 23 are formed at positions corresponding to the pockets 21*p*.

(2) Effects Obtained by the Present Embodiment

Also in the second embodiment, the same effect as that of the first embodiment can be obtained. The inclusions 22 are taken into the interface between the seed substrate 21 and the crystal body 30 to form the intermediate layer 24, and the radius of curvature of the c-plane 130 of the crystal body 30 can be larger than the radius of curvature of the c-plane 121 of the seed substrate 21. Further, in the second embodiment, since the seed substrate 21 has the pockets 21*p* as the inclusion formation regions, the intermediate layer 24 can be formed more reliably than in the first embodiment. Further, since number density, position, size, etc., of the pockets 21*p* are adjusted, the number density, position, size, etc., of the inclusions 22 or the closed spaces 23 can also be adjusted.

Third Embodiment (1) Method of Manufacturing a Crystal Substrate

A method of manufacturing the substrate 31 according to a third embodiment will be described. The differences from the first and second embodiments will be mainly described below. In the third embodiment as well, the substrate 31 is produced by the flux method through the steps S100 and S200 shown in FIG. 1, using the seed substrate 21 grown by VAS method as a seed crystal. However, the aspect of the seed substrate 21 is different from that of the first embodiment.

Figure 6A:
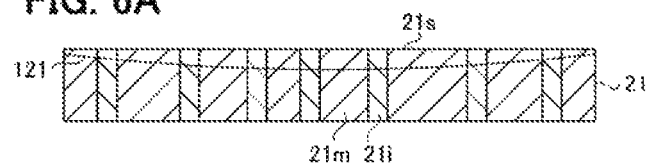
FIG. 6A to 6C are schematic cross-sectional views showing a production process of the substrate 31 in step S200 of a third embodiment.
Figure 6B:
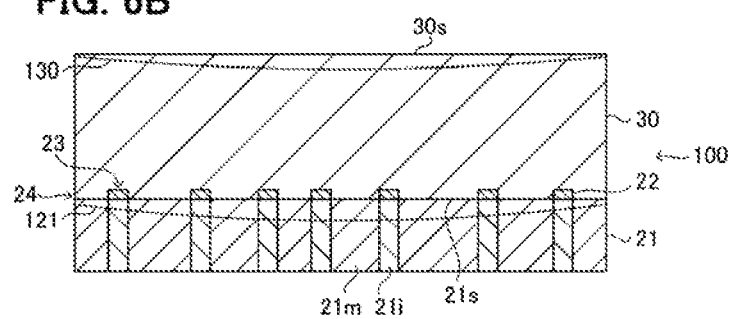
Figure 6C:
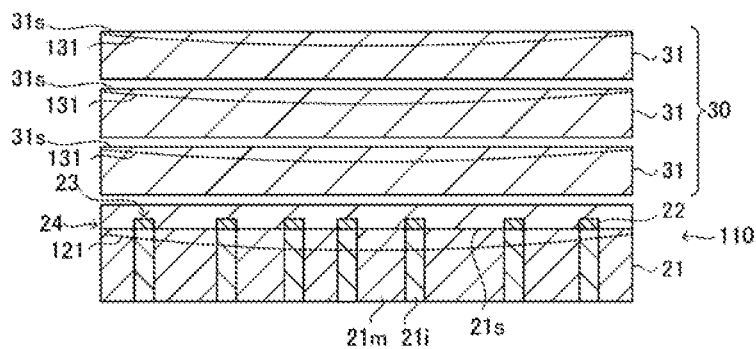

FIG. 6A to 6C are schematic cross-sectional views showing a production process of the substrate 31 in step S200 of the third embodiment. FIG. 6A shows the seed substrate 21 prepared in step S100. The seed substrate 21 of the third embodiment is different from the seed substrate 21 of the first and second embodiments in that it has ID 21*i*.

As described with reference to FIG. 3E, when the crystal body 20 constituting the seed substrate 21 is grown, ID with polarity in the c-axis direction reversed may occur. In the third embodiment, the seed substrate 21 is configured by the crystal body 20 containing ID 21*i*. The seed substrate 21 containing ID 21*i* is produced by applying, for example, a technique described in Japanese Patent No. 4424497 (referred to as a cited reference hereafter).

The cited reference proposes a technique of reducing the dislocation density by suppressing the initial nuclear density p to $6 \times 10^5 /cm^2$ or less when growing the group III nitride crystal by VAS method. In order to appropriately suppress the initial nuclear density p, a method of etching initial nuclei during initial nucleation, or a method of alternately performing an initial nuclear growth step and an initial nuclear etching step, is proposed. It has been proposed to use at least one of HCl gas and $H_2$ gas as an etching gas. The initial nuclear density p is expressed by a relational expression of "$\rho = f/h^2$", in a period when a substrate surface coverage by the initial nuclei is less than 0.8, wherein f is the surface coverage and satisfies 0≤f≤1, and h represents an average height of the initial nuclei at the time of measuring f.

The present inventors confirm the fact that the effect of reducing the dislocation density is obtained by applying the method of the cited reference, namely, by applying the initial core etching method proposed in the cited reference in the crystal growth by HVPE method in step S120. Further, in addition to the effect of reducing the dislocation density, it has been found that there is an effect of expanding the radius of curvature of the c-plane. Meanwhile, the present inventors have also found that ID can be generated by applying the method of the cited reference. Based on such knowledge, in the third embodiment, the seed substrate 21 is constituted using the crystal body 20 in which ID is generated while reducing the dislocation density by suppressing initial core density and expanding the radius of curvature of the c-plane. In the third embodiment, in the HVPE apparatus shown in FIG. 9, a gas supply pipe for etching gas, a flow controller, and a valve may be added, so that the etching gas can be supplied independently of the film forming gas etc.

The seed substrate 21 of the third embodiment has the main region 21m and ID 21i, and for example, is formed into a flat plate shape having a flat main surface 21s. The main region 21m is a normal region in which a GaN crystal is grown in +c axis direction. ID 21i is a polarity inversion region in which a GaN crystal is grown in −c axis direction opposite to the +c axis direction. ID 21i penetrates the seed substrate 21 in a thickness direction and is exposed to the main surface 21s which is the base under the crystal growth.

Step S210 shown in FIG. 6B, namely, the step of growing the crystal body 30 on the seed substrate 21 by the flux method, and step S220 shown in FIG. 6C, namely, the step of obtaining the substrate 31 from the grown crystal 30, are similar to those of the first and second embodiments. As processing conditions for the crystal growth processing in step S210, conditions similar to those of the first and second embodiments are exemplified.

The present inventors obtain a finding that, although details of the reason are unknown, when the crystal body 30 is grown by the flux method on the seed substrate 21 having ID 21i, the inclusions 22 are likely to be formed on ID 21i, and also obtain a finding that in the flux method, overgrowth from the main region 21m around ID 21i occurs, with neither the polarity reversed +c plane nor the ID −c plane grown on the ID 21i. Based on these findings, the ID 21i are provided as inclusion formation regions in the seed substrate 21 of the third embodiment. When growing the crystal body 30 by the flux method, the inclusions 22 are formed in such a way that the alkali metal contained in the mixed melt is taken on the ID 21i. The inclusions 22 become a cap layer that blocks the surface of ID 21i, and the cap layer (inclusions 22) suppresses the crystal growth with the ID 21i as a base. The cap layer (inclusions 22) is embedded by the crystal body 30 grown with the main region 21m as a base, and closed spaces 23 containing the alkali metal are formed at positions corresponding to ID 21i on the interface between the seed substrate 21 and the crystal body 30. In this embodiment, even if the seed substrate 21 contains ID 21i, the crystal growth in the −c axis direction does not occur with the ID 21i as a base. The entire crystal body 30 grown on the seed substrate 21 by the flux method grows in the +c axis direction, and does not contain ID.

As a feature of the laminated crystal substrate 100 having the seed substrate 21 and the crystal body 30 grown on the seed substrate 21, the feature described in the first embodiment can be given, and also, for example, the following feature can be given: the seed substrate 21 has the main regions 21m and ID 21i, and the closed spaces 23 are formed at the positions corresponding to the ID 21i.

A median value of a distribution of the number density of the ID 21i (referred to as ID number density hereafter) on the main surface 21s of the seed substrate 21 is for example, about 1,000 to 10,000 pieces/cm$^2$ (for example, about 3,000 pieces/cm$^2$). As a criterion that the distribution of the ID number density is uniform, standard deviation of the ID number density is, for example, 1,000 or less/cm$^2$, when the median value of the distribution of the ID number density is, for example, about 3,000 pieces/cm$^2$.

(2) Effects Obtained by the Present Embodiment

In the third embodiment as well, the same effect as that of the first embodiment can be obtained. The inclusions 22 are taken into the interface between the seed substrate 21 and the crystal body 30 to form the intermediate layer 24, the radius of curvature of the c-plane 130 of the crystal body 30 can be larger than the radius of curvature of the c-plane 121 of the seed substrate 21. Further, in the third embodiment, since the seed substrate 21 has ID 21i as inclusion formation regions, the intermediate layer 24 can be formed more reliably than in the first embodiment. Further, since the number density, position, size etc. of the ID 21i is adjusted, it is also possible to adjust the number density, position, size and the like of the inclusions 22 or the closed spaces 23.

Modified Example

Modified examples of the above-described first to third embodiments will be described. In the first to third embodiments, the method for producing the substrate 31 with the seed substrate 21 as a seed crystal has been described. In this modified example, a method for producing a substrate 41 with the substrate 31 as a seed crystal will be further described.

FIG. 7 is a flowchart showing a method of manufacturing the substrate 41 according to the modified example. This manufacturing method includes: step S100 of preparing the seed substrate 21 grown by the VAS method; step S200 of preparing the substrate 31 by a liquid phase method, specifically a flux method; and step S300 of preparing the substrate 41 by a vapor phase method, for example, HVPE method. Steps S100 and S200 are similar to those described with reference to FIG. 1 in the first to third embodiments, and the substrate 31 may be obtained by any of the manufacturing methods of the first to third embodiments.

(S300: Production of Crystal Substrate by Vapor Phase Method)

Figure 8A:
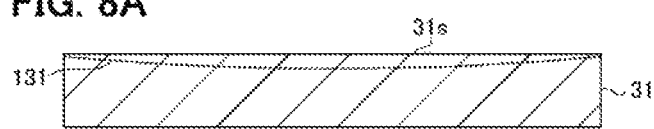
FIG. 8A to 8C are schematic cross-sectional views showing a production process of a substrate 41 in step S300 of a modified example.
Figure 8B:
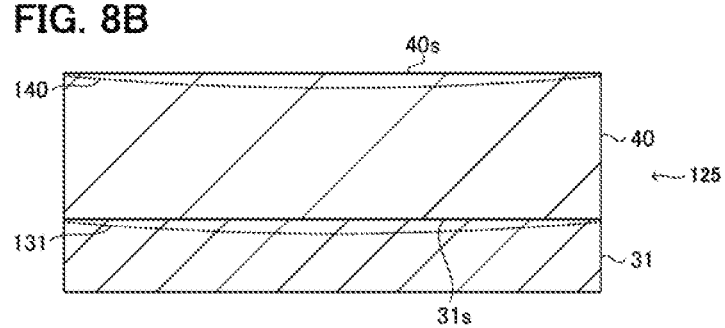
Figure 8C:
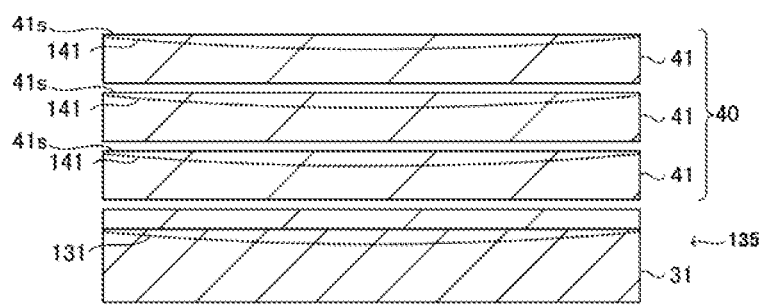

After the substrate 31 is produced in step S200, in step S300, the substrate 41 is produced by the vapor phase method, for example, the HVPE method. FIGS. 8A to 8C are schematic cross-sectional views showing a production process of the substrate 41 in step S300.

(S310: Crystal Growth by HVPE Method)

Step S300 includes steps S310 and S320. In step S310, as shown in FIG. 8B, the crystal body 40 is formed by epitaxially growing the GaN single crystal on the substrate 31 by the HVPE method. Step S310 can be performed in the same processing procedure as Step S120 regarding production of the seed substrate 21. As processing conditions of the crystal growth process of step S310, the conditions similar to those in step S120 are exemplified. As the substrate 31 used for the seed crystal of the crystal body 40, the crystal body 30 (the laminated crystal substrate 100 illustrated in FIG. 4B or the like) in a state of being laminated on the seed substrate 21 may be used.

A thickness of the crystal body 40 to be grown is preferably a thickness at which at least one sheet of freestanding substrate 41 can be obtained from the crystal body 40, for example, a thickness of 0.2 mm or more. An upper limit of the thickness of the crystal body 20 to be grown is not particularly limited.

(S320: Machining and Polishing)

In step S320, as shown in FIG. 8C, the crystal body 40 grown in step S310 is cut by machining, for example, by a wire saw, and separated from the substrate 31. A laminated crystal substrate 135 having the substrate 31 and a root portion of the crystal body 40 remaining by separating the crystal body 40, may be reused as a seed crystal for crystal growth by the HVPE method or the like.

The separated crystal body 40 is subjected to machining and/or polishing, as needed, to obtain the substrate 41 (crystal body 40 as a freestanding substrate). For example, one sheet of substrate 41 may be obtained from an entire crystal body 40. Further for example, a plurality of substrates 41 may be obtained from the entire crystal body 40 by slicing the crystal body 40 into a plurality of sheets. The obtained substrate 41 may or may not be polished, if necessary. One of the two main surfaces may be polished. The separated crystal body 40 may be used as the substrate 41 as it is.

The radius of curvature of the c-plane 140 of the crystal body 40 is sometimes changed from the radius of curvature of the c-plane 140 of the crystal body 40 before separation, due to the separation of the crystal body 40 from the substrate 31. Further, the radius of curvature of the c-plane 141 of the substrate 41 is sometimes changed from the radius of curvature of the c-plane 140 of the separated crystal body 40, due to machining or polishing on the separated crystal body 40.

FIG. 8C shows the substrate 41 formed into a flat plate shape. The substrate 41 is configured to have c-plane 141 as a low index crystal plane closest to the main surface 41s, so that the c-plane 141 is curved in a concave spherical shape with respect to the main surface 41s (with respect to the main surface 41s of either one of both main surfaces of the seed substrate 41). The c-plane 141 has a constant radius of curvature (in the major area) because distortion from the spherical shape is suppressed.

As described above, in step S300, the substrate 41 is produced with the substrate 31 as a seed crystal, by a vapor phase method, for example, HVPE method. The HVPE method makes it possible to grow a crystal at a higher growth rate than the flux method. Therefore, this modified example is preferably used as a technique of obtaining the substrate 31 with enhanced crystallinity by the flux method, and thereafter obtaining the thick film crystal body 40 with the substrate 31 as a seed crystal.

The radius of curvature of the c-plane 141 of the substrate 41 is at least as large as the radius of curvature of the c-plane 131 of the substrate 31 and larger than the radius of curvature of the c-plane 121 of the seed substrate 21. The radius of curvature of the c-plane 141 of the substrate 41 is preferably 10 m or more, more preferably 15 m or more, and still more preferably 20 m or more. The substrate 41 may be used, for example, as a substrate for manufacturing a semiconductor device, or, for example, may be further used as a seed crystal. The size of the substrate 41 is preferably, for example, 4 inches or more in diameter, similarly to the size of the substrate 31.

The crystallinity of the substrate 41 is as high as that of the substrate 31. In the substrate 41, a largest dislocation density is preferably, for example, $3 \times 10^6/cm^2$ or less, and an average dislocation density is preferably, for example, $1 \times 10^6/cm^2$ or less. A smallest dislocation density is not particularly limited. In the substrate 41, the ratio of the largest dislocation density to the smallest dislocation density can be larger as the smallest dislocation density is lower, and the standard is, for example, 100 times or less, and for example, 10 times or less.

As described above, the embodiments and the modified examples of the present invention have been specifically described. However, the present invention is not limited to the above-described embodiments and modified examples, and can be variously changed in a range which does not deviate from the gist of the invention.

For example, the crystal body 30 may be grown using the seed substrate 21 having both pockets 21p and ID 21i as the inclusion formation regions, which are exemplified in the second and third embodiments described above. Further for example, in the modified example, one or more substrates may be obtained from the laminated crystal substrate 125 having the substrate 31 and the crystal body 40 without separating the crystal body 40 from the substrate 31. Further for example, when growing the crystal body 20, 30 or 40, an impurity such as a conductivity determining impurity may be added as needed.

Experimental Example

Next, experimental examples will be described. In the experimental example, as in the above-described modified example, the seed substrate 21 grown by the VAS method was prepared, and the substrate 31 was produced by the flux method using the seed substrate 21 as a seed crystal, and further the substrate 41 was produced by the HVPE method using the substrate 31 as a seed crystal. The seed substrate 21 including ID was used as the seed substrate 21 by the VAS method, as in the third embodiment. The seed substrate 21, with the center off-angle inclined in the m-axis direction, was used. The diameter of each of the seed substrate 21, the substrate 31 and the substrate 41 is 4 inches.

FIG. 11 is a table showing the results of this experimental example, and the radius of curvature of the c-plane in the mutually orthogonal a-axis direction and m-axis direction of each crystal body and each substrate is shown in m units. The value shown in the column of "VAS method" is the radius of curvature of the c-plane in the seed substrate 21. The value shown in the "flux method/as-grown" column is the radius of curvature of the c-plane in the crystal body 30 in a state of being grown by the flux method on seed substrate 21 and laminated on the seed substrate 21. The value shown in the column of "flux method/freestanding substrate" is the radius of curvature of the c-plane in the substrate 31 constituted by the crystal body 30 which is separated from the seed substrate 21. The value shown in the "HVPE method/as-grown" column is the radius of curvature of the c-plane in the crystal body 40 in a state of being grown by the HVPE method on the substrate 31 and laminated on the substrate 31. The value shown in the column of "HVPE method/freestanding substrate" is the radius of curvature of the c-plane in the substrate 41 constituted by the crystal 40 which is separated from the substrate 31.

Each radius of curvature was obtained by X-ray diffraction measurement. The X-ray diffraction measurement is a measurement method utilizing the occurrence of diffraction when $2d \sin \theta = \lambda$ (reflection condition of Bragg) is satisfied when X-rays are incident on a crystal at an angle of θ. Here, d is an inter-planar spacing of crystal planes thereby causing diffraction, and λ is a wavelength of X-ray. Namely, in order to receive only the diffraction of crystal planes of the inter-planar spacing d, an arrangement may be such that an angle between a direction estimated by a light receiving device (detector) and an X-ray traveling direction is 2θ. X-ray rocking curve measurement method is the method of fixing the light receiving device at the position of 2θ and changing only the incident angle of the X-ray to the sample within an arbitrary range. Here, when the incident angle of the X-ray to the sample surface is ω, diffraction occurs when ω=2θ/2, in a case where a crystal plane which is a measurement object exists in a state that the inter-planar spacing d is completely parallel to the sample surface. On the other hand, diffraction occurs when ω=2θ/2−Δω, in a case where the crystal plane which is a measurement object exists in a state that the inter-planar spacing d is inclined at an angle of Δω with respect to the sample surface. If the crystal plane which is a measurement object is approximately spherical in the sample, the angle Δω between the sample surface and the crystal plane which is a measurement object is different depending on an arbitrary position of the sample, resulting in the difference in ω. ω is a peak angle of the X-ray rocking curve.

For measurement, an X-ray diffractometer X'pert MRD manufactured by Spectris Inc. was used. Used X-ray source was a tube type using a Cu target. After collimating the generated X-rays using an X-ray mirror, only CuKα1 rays were extracted using a Ge (220) double reflection monochromator. The wavelength λ is 1.54056 Å. Further, a slit with an opening width of 100 μm was provided at the exit light opening of the monochromator to narrow an irradiation width of the X-rays. Since the radius of curvature of the c-plane of GaN is desired to obtain, the crystal plane which is a measurement object was set as (0002) plane. The incident angle satisfying the Bragg's reflection condition is 17.285° when d0002=c/2=2.5925 Å is satisfied, because the c-axis length of GaN is ideally 5.185 Å. Accordingly, the width of the footprint of the incident X-ray on the sample at this time is 337 μm, which may be considered to be about 0.3 mm. Therefore, in order to examine a c-plane shape and its radius of curvature in detail with maximum resolution, the peak angle of the X-ray rocking curve was evaluated by changing a measurement position at 0.3 mm pitch from x=−45 mm to 45 mm on an arbitrary line segment parallel to the m-axis passing through the center of the sample. If the curvature is constant, when the measurement result is plotted on the horizontal axis x (m) and the vertical axis ω (rad), it should be possible to fit with a linear function, and a reciprocal of a first derivative is the radius of curvature R. Further, the same evaluation was performed in a direction orthogonal to the previous line segment (which is a direction parallel to the a-axis) to thereby obtain the radius of curvature. In this manner, the radius of curvature in the m-axis direction and the radius of curvature in the a-axis direction were obtained.

As shown in FIG. 11, in each of the a-axis direction and the m-axis direction, the radius of curvature of the c-plane in the crystal body 30 (flux method/as-grown) grown by the flux method using the seed substrate 21 as a seed crystal and the substrate 31 (flux method freestanding substrate), is larger than the radius of curvature of the c-plane in the seed substrate 21 grown by the VAS method. Thereby, in the crystal body 30 and the substrate 31, the uniformity of the off-angle in the plane is improved as compared with the seed substrate 21. In the crystal body 40 (HVPE method/as-grown) grown by the HVPE method using the substrate 31 as a seed crystal and the substrate 41 (HVPE method/ freestanding substrate) as well, similarly, the radius of curvature of the c-plane in the a-axis direction and the in-axis direction is larger than that of the seed substrate 21, and the uniformity of the off-angle in the plane is improved.

In the seed substrate 21 used in this experimental example, the radius of curvature of the c-plane is as large as 10 m or more in both the a-axis direction and the m-axis direction. Since the crystal growth is carried out on the seed substrate 21 by the flux method, the radius of curvature of the c-plane in both the a-axis direction and the m-axis direction is larger, such as 15 m or more, or about 20 in or more. The radius of curvature of the c-plane after growth by the HVPE method is further increased to 25 m or more in both the a-axis direction and the m-axis direction. In this experimental example, the radius of curvature of the c-plane in the seed substrate 21 is different between the a-axis direction and the m-axis direction due to the inclination of the center off-angle. The large/small relationship between the a-axis direction and the m-axis direction of the radius of curvature of the c-plane in the seed substrate 21 is likely not to change after growth by the flux method and further after growth by the HVPE method.

Preferable Aspects of the Present Invention

Hereinafter, preferable aspects of the present invention will be supplementary described.
(Supplementary Description 1)

There is provided a method of manufacturing a crystal substrate, including:

preparing a first crystal body which is a substrate comprising a single crystal of group III nitride produced by a vapor phase method and having a first main surface, and in which c-plane of the single crystal is curved in a concave spherical shape with a predetermined curvature; and growing a second crystal body comprising a single crystal of group III nitride on the first main surface, in a mixed melt containing an alkali metal and a group III element.
(Supplementary Description 2)

The method of manufacturing a crystal substrate according to supplementary description 1, wherein a largest dislocation density in the first main surface of the first crystal body is less than $1 \times 10^7/cm^2$, preferably $5 \times 10^6/cm^2$ or less.
(Supplementary Description 3)

The method of manufacturing a crystal substrate according to supplementary description 1 or 2, wherein in growing the second crystal body, the alkali metal contained in the mixed melt is taken into an interface between the first crystal body and the second crystal body, to form an intermediate layer having a plurality of closed spaces containing the alkali metal.
(Supplementary Description 4)

The method of manufacturing a crystal substrate according to supplementary description 3, wherein in growing the second crystal body, a compressive stress is relieved by the intermediate layer, the compressive stress being generated in the second crystal body as the crystal grows, to thereby make a radius of curvature of c-plane in the second crystal body larger than a radius of curvature of c-plane in the first crystal body.
(Supplementary Description 5)

The method of manufacturing a crystal substrate according to supplementary description 3 or 4, wherein the first main surface of the first crystal body is provided with a region configured to easily retain the mixed melt.

(Supplementary Description 6)

The method of manufacturing a crystal substrate according to any one of supplementary descriptions 3 to 5, wherein in preparing the first crystal body, a crystal body having a main region and a pocket which is a region recessed with respect to the main region is prepared as the first crystal body, and in growing the second crystal body, a cap layer is formed for closing a surface of the pocket by the alkali metal contained in the mixed melt to thereby suppress a crystal growth, with the pocket as a base, and meanwhile the cap layer is embedded by a crystal grown with the main region as a base, and the closed space containing the alkali metal is formed at a position corresponding to the pocket on the interface between the first crystal body and the second crystal body.

(Supplementary Description 7)

The method of manufacturing a crystal substrate according to any one of supplementary descriptions 3 to 5, wherein in preparing the first crystal body, a crystal body is prepared as the first crystal body, having a main region and a polarity inversion region in which polarity in c-axis direction is inverted with respect to the main region, and in growing the second crystal body, a cap layer is formed for closing a surface of the polarity inversion region by the alkali metal contained in the mixed melt to thereby suppress a crystal growth, with the polarity inversion region as a base, and meanwhile the cap layer is embedded by a crystal grown with the main region as a base, and the closed space containing the alkali metal is formed at a position corresponding to the polarity inversion region on the interface between the first crystal body and the second crystal body.

(Supplementary Description 8)

The method of manufacturing a crystal substrate according to any one of supplementary descriptions 1 to 7, further including: obtaining a crystal substrate from a crystal body containing the second crystal body.

(Supplementary Description 9)

The method of manufacturing a crystal substrate according to any one of supplementary descriptions 1 to 8, further including: growing a third crystal body comprising a single crystal of group III nitride on the second crystal body by a vapor phase method.

(Supplementary Description 10)

The crystal substrate according to supplementary description 9, wherein a radius of curvature of c-plane in the third crystalline body is larger than a radius of curvature of c-plane in the first crystal body.

(Supplementary Description 11)

The method of manufacturing a crystal substrate according to supplementary description 9 or 10, further including: obtaining a crystal substrate from a crystal body containing the third crystal body.

(Supplementary Description 12)

A crystal substrate, including:

a first crystal body which is a substrate comprising a single crystal of group III nitride produced by vapor phase method and having a first main surface, and in which c-plane of the single crystal is curved in a concave spherical shape with a predetermined curvature; and a second crystal body comprising a single crystal of group III nitride grown on the first main surface using a mixed melt containing an alkali metal and a group III element.

(Supplementary Description 13)

The crystal substrate according to supplementary description 12, including an intermediate layer having a plurality of closed spaces containing the alkali metal on an interface between the first crystal body and the second crystal body.

(Supplementary Description 14)

The crystal substrate according to supplementary description 12 or 13, wherein a radius of curvature of c-plane in the second crystal body is larger than a radius of curvature of c-plane in the first crystal body.

(Supplementary Description 15)

The crystal substrate according to any one of supplementary descriptions 1 to 14, wherein the first crystal body has a main region and a pocket which is a region recessed with respect to the main region, and the closed space is formed at a position corresponding to the pocket.

(Supplementary Description 16)

The crystal substrate according to any one of supplementary descriptions 12 to 14, wherein the first crystal body has a main region, and a polarity inversion region in which polarity in c-axis direction is inverted with respect to the main region, and the closed space is formed at a position corresponding to the polarity inversion region.

(Supplementary Description 17)

A crystal substrate which is a substrate comprising a single crystal of group III nitride, wherein c-plane of the single crystal is curved in a concave spherical shape with a radius of curvature of preferably 10 m or more, more preferably 15 m or more, still more preferably 20 in or more, with respect to one of the two main surfaces of the substrate.

(Supplementary Description 18)

The crystal substrate according to supplementary description 17, wherein a radius of curvature in a-axis direction of the c-plane of the single crystal and a radius of curvature in m-axis direction of the c-plane of the single crystal are each preferably 10 m or more, more preferably 15 m or more, still more preferably 20 m or more.

(Supplementary Description 19)

The crystal substrate according to supplementary description 17 or 18, wherein the c-plane of the single crystal has a constant radius of curvature in a region of 80% or more of an area of the one main surface viewed in plan view.

(Supplementary Description 20)

The method of manufacturing a crystal substrate according to any one of supplementary descriptions 17 to 19, wherein a largest dislocation density in the one main surface of the single crystal is $3 \times 10^6 / cm^2$ or less.

(Supplementary Description 21)

The crystal substrate according to any one of supplementary descriptions 12 to 20, having a diameter of 4 inches or more.

What is claimed is:

1. A crystal substrate which is a substrate consisting of a single crystal of group III nitride, having a diameter of 4 inches or more, and in which c-plane of the single crystal is curved in a concave spherical shape toward inside of the substrate, when a main surface of the substrate is viewed from +c side with a radius of curvature of 15 m or more, the c-plane of the single crystal has a constant radius of curvature in a region of 80% or more of an area of the main surface viewed in plan view, and the substrate consists of a single domain, wherein a thickness of the substrate is 0.2 mm or more, and wherein the radius of curvature of the c-plane of the single crystal in a-axis direction is 27.2 m or more and the radius of curvature of the c-plane of the single crystal in m-axis direction is 35.6 m or more.

2. The crystal substrate according to claim 1, wherein a largest dislocation density in the main surface is $3\times10^6/cm^2$ or less.

3. The crystal substrate according to claim 1, wherein a radius of curvature of the c-plane of the single crystal in a-axis direction is different from a radius of curvature of the c-plane of the single crystal in m-axis direction.

* * * * *

UNITED STATES PATENT AND TRADEMARK OFFICE
CERTIFICATE OF CORRECTION

PATENT NO. : 11,718,927 B2
APPLICATION NO. : 16/353115
DATED : August 8, 2023
INVENTOR(S) : Takehiro Yoshida et al.

Page 1 of 1

It is certified that error appears in the above-identified patent and that said Letters Patent is hereby corrected as shown below:

In the Specification

Column 5, Line 8, "film comprising Gall single" should read --film comprising GaN single--.

Signed and Sealed this
Twenty-sixth Day of November, 2024

Katherine Kelly Vidal
*Director of the United States Patent and Trademark Office*